(12) United States Patent
Burke et al.

(10) Patent No.: US 10,643,852 B2
(45) Date of Patent: May 5, 2020

(54) PROCESS OF FORMING AN ELECTRONIC DEVICE INCLUDING EXPOSING A SUBSTRATE TO AN OXIDIZING AMBIENT

(71) Applicant: SEMICONDUCTOR COMPONENTS INDUSTRIES, LLC, Phoenix, AZ (US)

(72) Inventors: Peter A. Burke, Portland, OR (US); James Kimball, Boring, OR (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 15/708,447

(22) Filed: Sep. 19, 2017

(65) Prior Publication Data

US 2018/0096849 A1 Apr. 5, 2018

Related U.S. Application Data

(60) Provisional application No. 62/402,440, filed on Sep. 30, 2016.

(51) Int. Cl.
*H01L 21/28* (2006.01)
*H01L 21/265* (2006.01)
(Continued)

(52) U.S. Cl.
CPC .. *H01L 21/28114* (2013.01); *H01L 21/02236* (2013.01); *H01L 21/2658* (2013.01);
(Continued)

(58) Field of Classification Search
CPC ......... H01L 21/28114; H01L 21/02236; H01L 21/02255; H01L 21/26506; H01L 21/26533; H01L 21/2658; H01L 21/26586; H01L 21/30604; H01L 29/407; H01L 29/417; H01L 29/42336; H01L 29/4236; H01L 29/66348; H01L 29/66825; H01L 29/7397; H01L 29/7889
See application file for complete search history.

(56) References Cited

U.S. PATENT DOCUMENTS

| | | |
|---|---|---|
| 4,476,622 A | 10/1984 | Cogan |
| 4,764,248 A | 8/1988 | Bhattacherjee et al. |

(Continued)

*Primary Examiner* — Timor Karimy
(74) *Attorney, Agent, or Firm* — Abel Schillinger, LLP

(57) ABSTRACT

A process of forming electronic device can include providing a substrate having a first portion and a second portion; introducing a nitrogen-containing species into the second portion of the substrate; and exposing the substrate to an oxidizing ambient, wherein a thicker oxide is grown from the first portion as compared to the second portion. In an embodiment, the process can include removing the first portion while the second portion of the substrate that includes the nitrogen-containing species remains. In another embodiment, the process can be used to form different thicknesses of an oxide layer at different portions along a sidewall of a trench. The process may be used in other applications where different thicknesses of oxide layers are to be formed during the same oxidation cycle, such as forming a tunnel dielectric layer and a gate dielectric layer for a floating gate memory cell.

20 Claims, 4 Drawing Sheets

(51) Int. Cl.
    *H01L 21/02*       (2006.01)
    *H01L 29/66*       (2006.01)
    *H01L 29/423*      (2006.01)
    *H01L 29/40*       (2006.01)
    *H01L 29/788*      (2006.01)
    *H01L 21/306*      (2006.01)
    *H01L 29/417*      (2006.01)
    *H01L 29/739*      (2006.01)

(52) U.S. Cl.
    CPC .. *H01L 21/26506* (2013.01); *H01L 21/26533* (2013.01); *H01L 21/26586* (2013.01); *H01L 21/30604* (2013.01); *H01L 29/407* (2013.01); *H01L 29/417* (2013.01); *H01L 29/4236* (2013.01); *H01L 29/42336* (2013.01); *H01L 29/66348* (2013.01); *H01L 29/66825* (2013.01); *H01L 29/7397* (2013.01); *H01L 29/7889* (2013.01); *H01L 21/02238* (2013.01); *H01L 21/02255* (2013.01)

(56) References Cited

U.S. PATENT DOCUMENTS

| | | |
|---|---|---|
| 6,150,670 A | 11/2000 | Faltermeier et al. |
| 6,348,388 B1 | 2/2002 | Faltermeier et al. |
| 9,070,585 B2 | 6/2015 | Hossain et al. |
| 2003/0235959 A1 | 12/2003 | Lichtenberger et al. |
| 2006/0166419 A1 | 7/2006 | Shimoyama et al. |
| 2009/0014785 A1* | 1/2009 | Moens .............. H01L 29/42368 257/330 |
| 2009/0130818 A1* | 5/2009 | Lin .................. H01L 21/76224 438/424 |
| 2010/0163935 A1* | 7/2010 | Shimizu ............ H01L 29/42316 257/263 |
| 2011/0024846 A1* | 2/2011 | Kammler .......... H01L 21/76229 257/369 |
| 2011/0133258 A1* | 6/2011 | Chen ................ H01L 29/66666 257/288 |
| 2012/0187474 A1* | 7/2012 | Rexer .................. H01L 29/407 257/330 |
| 2017/0069727 A1* | 3/2017 | Blanchard .......... H01L 29/7813 |

\* cited by examiner

PROCESS OF FORMING AN ELECTRONIC DEVICE INCLUDING EXPOSING A SUBSTRATE TO AN OXIDIZING AMBIENT

CROSS-REFERENCE TO RELATED APPLICATION

This application claims priority under 35 U.S.C. § 119(e) to U.S. Provisional Patent Application No. 62/402,440, entitled "Process of Forming an Electronic Device Including Exposing a Substrate to an Oxidizing Ambient", by Peter A. Burke et al., filed Sep. 30, 2016, which is assigned to the current assignee hereof and incorporated herein by reference in its entirety.

FIELD OF THE DISCLOSURE

The present disclosure relates to processes of forming electronic devices including exposing substrates to an oxidizing ambient.

RELATED ART

High power vertical field-effect transistors and insulated gate bipolar transistors can include shield electrodes to help with the performance of the transistors. The shield electrodes can be located below and electrically isolated from overlying gate electrodes. In particular devices, the shield and gate electrodes are formed within the same trench, and insulating layers are disposed between the electrodes and the sidewalls of the trenches. The insulating layer between the shield electrodes and the sidewalls of the trenches is thicker than the insulating (gate dielectric) layer between the gate electrodes and the sidewalls of the trenches. A complex process sequence is used to obtain the different thicknesses, and such complex process sequence has many steps, all of which impact the cost and overall yield of the device. A need exists for a new process flow that has fewer steps and more process margin.

BRIEF DESCRIPTION OF THE DRAWINGS

Embodiments are illustrated by way of example and are not limited in the accompanying figures.

Figure 1:
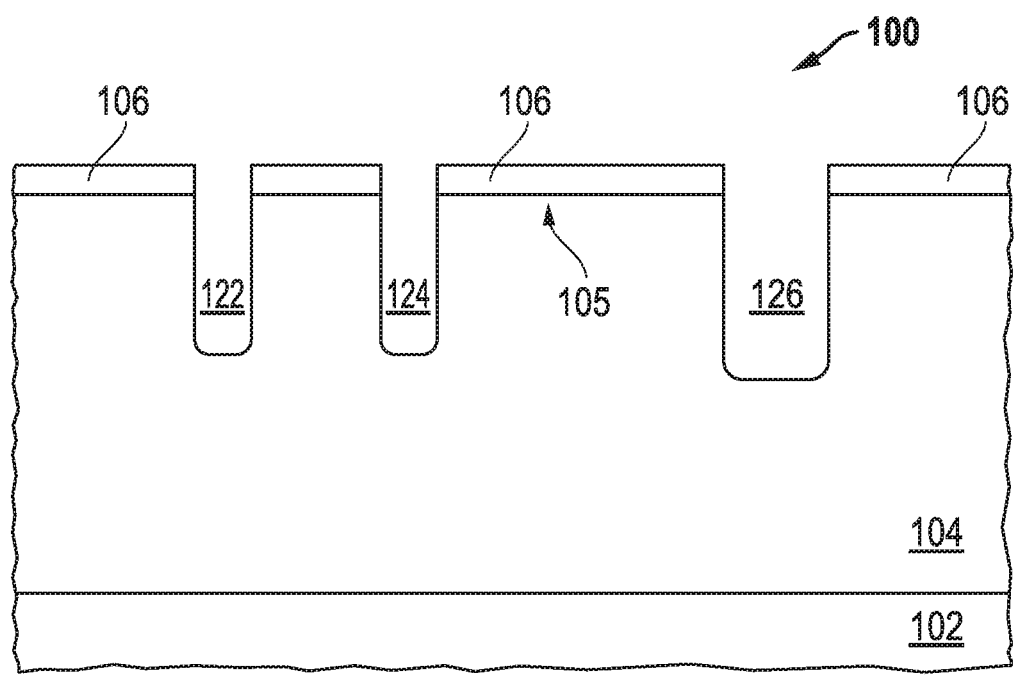
FIG. 1 includes an illustration of a cross-sectional view of a portion of a workpiece after patterning a substrate to define trenches.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other teachings can certainly be utilized in this application. While numerical ranges are described herein to provide a better understanding of particular embodiments, after reading this specification, skilled artisans will appreciate that values outside the numerical ranges may be used without departing from the scope of the present invention.

The terms "on," "overlying," and "over" may be used to indicate that two or more elements are in direct physical contact with each other. However, "over" may also mean that two or more elements are not in direct contact with each other. For example, "over" may mean that one element is above another element but the elements do not contact each other and may have another element or elements in between the two elements.

The terms "comprises," "comprising," "includes," "including," "has," "having," or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read such that the plurals include one or at least one and the singular also includes the plural, unless it is clear that it is meant otherwise. For example, when a single item is described herein, more than one item may be used in place of a single item. Similarly, where more than one item is described herein, a single item may be substituted for that more than one item.

The use of the word "about", "approximately", or "substantially" is intended to mean that a value of a parameter is close to a stated value or position. However, minor differences may prevent the values or positions from being exactly as stated. Thus, differences of up to ten percent (10%) (and up to twenty percent (20%) for semiconductor doping concentrations) for the value are reasonable differences from the ideal goal of exactly as described.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the semiconductor and electronic arts.

A process has been developed that allows different portions of a substrate to be oxidized at different rates during the same oxidation cycle. A process of forming electronic device can include providing a substrate having a first portion and a second portion; introducing a nitrogen-containing species into the second portion of the substrate; and exposing the substrate to an oxidizing ambient, wherein a thicker oxide is grown from the first portion as compared to the second portion. In an embodiment, the process can include removing the first portion while the second portion of the substrate that includes the nitrogen-containing species remains. In another embodiment, the process can be used to form different thicknesses of an oxide layer at different portions along a sidewall of a trench. The process may be used in other applications where different thicknesses of oxide layers are to be formed during the same oxidation cycle, such as forming a tunnel dielectric layer and a gate dielectric layer for a floating gate memory cell.

In the description below, a process will be described with respect to formation of a vertical field-effect transistor structure. The process can be modified to form an insulated gate bipolar transistor structure. Other transistor structures and electronic components can be formed using the concepts as described herein, such as a floating gate memory cell that includes a tunnel dielectric layer for a tunneling window and a gate dielectric layer for a transistor structure of a floating gate memory cell. The process can allow for a differential oxide growth rate to form different thicknesses of oxide to be grown during a single oxidation cycle. Clearly, the embodiments described are merely illustrative and do not limit the invention, which is defined by the claims appended hereto.

FIG. 1 includes an illustration of a cross-sectional view of a portion of a workpiece 100. The workpiece 100 includes an underlying doped region 102, a semiconductor layer 104 having a primary surface 105, a masking layer 106, and trenches 122, 124, and 126. The underlying doped region 102 can be part of a substrate that may be lightly doped or heavily doped, n-type or p-type. For the purposes of this specification, heavily doped is intended to mean a peak dopant concentration of at least $10^{19}$ atoms/cm$^3$. The underlying doped region 102 can be a portion of a heavily doped substrate (e.g., a heavily n-type doped wafer) or may be a buried doped region overlying a base layer of opposite conductivity type or overlying a buried insulating layer (not illustrated) that lies between the base layer and the buried doped region. In an embodiment, the underlying doped region 102 is heavily doped with an n-type dopant, such as phosphorus, arsenic, antimony, or any combination thereof. In a particular embodiment, the underlying doped region 102 includes arsenic or antimony if diffusion of the underlying doped region 102 is to be kept low.

The semiconductor layer 104 overlies the underlying doped region 102 and can include a Group 14 element (for example, carbon, silicon, germanium, or any combination thereof) and any of the dopants as described with respect to the underlying doped region 102 or dopants of the opposite conductivity type. In an embodiment, the semiconductor layer 104 is a moderately doped n-type or p-type epitaxial silicon layer having a thickness in a range of approximately 0.5 microns to approximately 4.0 microns, and a doping concentration no greater than approximately $10^{18}$ atoms/cm$^3$, and in another embodiment, a doping concentration of at least approximately $10^{15}$ atoms/cm$^3$. The doping concentration and thickness can be adjusted to achieve a needed or desired breakdown voltage for the electronic device. The doping concentration of the semiconductor layer 104 at this point in the process flow and within approximately 1 micron of the primary surface 105 may be referred to as the background doping concentration. The primary surface 105 is spaced apart from underlying doped region 102. The semiconductor layer 104 may include a single semiconductor layer or a plurality of discrete semiconductor layers. The doping concentration may be relatively higher near the underlying doped region 102 and relatively lower near the primary surface 105.

The masking layer 106 is used to protect portions of the semiconductor layer 104 during patterning that defines the trenches 122, 124, and 126. In an embodiment, the masking layer 106 may include one or more different films, and such one or more films can include a material dissimilar to the semiconductor layer 104. In a particular embodiment, the masking layer 106 includes an oxide, a nitride, an oxynitride, or any combination thereof and has a thickness in a range of 50 nm to 600 nm.

A patterned resist layer (not illustrated) is formed over the masking layer 106, and the masking layer 106 is etched, and the patterned resist layer is removed. The semiconductor layer 104 is etched to define trenches 122, 124, and 126 that extend from the primary surface 105 towards the underlying doped region 102. The trenches 122 and 124 are within an active area where transistor structures will be formed, and the trench 126 is within a conductive electrode contact area where a contact will be formed for subsequently formed. Many other trenches 122 and 124 may be formed but are not illustrated in FIG. 1.

The trenches 122, 124, and 126 may have substantially the same depth or different depths. In an embodiment, each of the trenches 122, 124, and 126 has a depth in a range of approximately 1.1 microns to approximately 4.0 microns. When expressed as a percentage of the thickness of the semiconductor layer 104, the trenches can extend to a depth that is in a range of approximately 20% to approximately 100% of the thickness of the semiconductor layer 104.

The trenches 122, 124, and 126 can have substantially the same width or different widths. In an embodiment, the trench 126 is wider than the trenches 122 and 124 and may be up to approximately two times wider than either or both of the trenches 122 and 124. In an embodiment, each of the trenches can have a width in a range of approximately 0.11 micron to approximately 0.9 micron. In an embodiment, the trenches 122 and 124 can have a width in a range of approximately 0.11 micron to approximately 0.5 micron, and the trench 126 can have a width in a range of approximately 0.3 to approximately 0.9 micron. In another embodiment, the trench 126 can have a width that is in a range of approximately 1 to 3 times the width of any of one of the trenches 122 and 124. The space between immediately adjacent trenches 122 and 124 can be in a range of approximately 0.11 micron to approximately 0.9 micron, and the space between the trench 126 and the nearest of trenches 122 and 124 can be in a range of approximately 0.11 microns to approximately 2 microns, or even greater. The cell pitch (for example, gate-to-gate) may be in a range of approximately 0.2 micron to 4.0 microns.

Many of the dimensions for the trenches and spaces between the trenches may be expressed as a multiple of design rules (such as the smallest feature size for the design rules or "F"). In an embodiment, each of the trenches can have a width in a range of approximately 1F to approximately 5F. In an embodiment, the trenches 122 and 124 can have a width in a range of approximately 1F to approximately 2.5F, and the trench 126 can have a width in a range of approximately 1F to 5F micron. The space between immediately adjacent trenches 122 and 124 can be in a range of approximately 1F to approximately 5F, and the space between the trench 126 and the nearest of trenches 122 and 124 can be in a range of approximately 1F to approximately 5F, or even greater. The cell pitch (for example, gate-to-gate) may be in a range of approximately 4F to approximately 9F.

Figure 2:
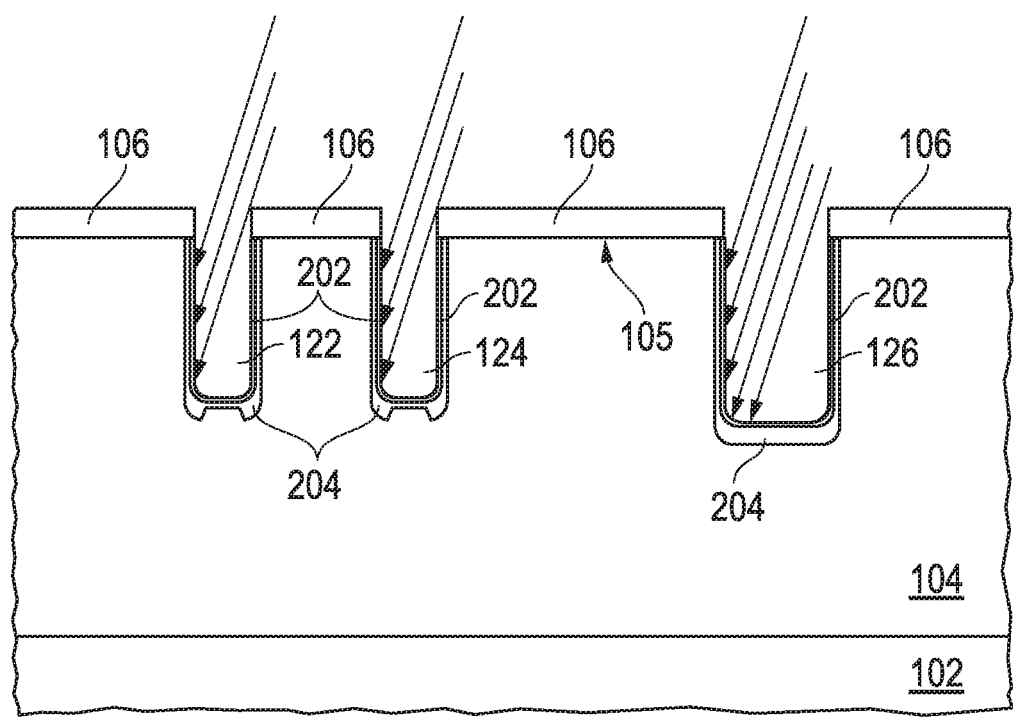
FIG. 2 includes an illustration of a cross-sectional view of the workpiece of FIG. 1 when introducing a nitrogen-containing species within the trenches.

If needed or desired, an implant screen layer 202 can be formed at this time. The implant screen layer 202 can help to reduce the effects of implant channeling. In an embodiment as illustrated in FIG. 2, the implant screen layer 202 can be a thermally grown oxide and may help to round the corners of the trenches 122, 124, and 126 near the primary surface 105 and bottoms of the trenches 122, 124, and 126. The implant screen layer 202 can have a thickness in a range of 3 nm to 30 nm.

A nitrogen-containing species can be introduced into the substrate to form regions 204 along sidewalls of the trenches 122, 124, and 126. The nitrogen-containing species can help to reduce the oxidation rate during a subsequent oxidation. In an embodiment, the nitrogen-containing species can be introduced into the substrate by ion implantation using a tilt angle. The tilt angle can depend in part on the width and depth of the trench. In an embodiment, the tilt angle may be selected to keep the implant dose along the centers of the bottoms of trenches 122 and 124 lower due to shadowing effects than if the centers of the bottoms were to receive the full dose. In an embodiment, the tilt angle may be in a range of 7° to 30°, wherein 0° corresponds to a direction perpendicular to the primary surface 105. The workpiece may be rotated during introducing the nitrogen-containing species or between different portions of introducing the nitrogen-containing species to ensure the nitrogen-containing species is implanted along different surfaces of the sidewalls of the trenches 122, 124, and 126. In another embodiment, the nitrogen-containing species can be introduced by plasma immersion ion implantation.

A source gas for the nitrogen-containing species can include $N_2$, $N_2H_2$, $NH_3$, or the like. For ion implantation, $N_2$ is particular well suited as the source gas, as it does not include any other atoms, such as H. The dose is relatively heavy and is at least $1 \times 10^{15}$ ions/cm$^2$. Although there is no theoretical upper limit on the dose, the dose can be at most $1 \times 10^{19}$ ions/cm$^2$, so that implant damage is not too excessive. In an embodiment, the dose is in a range of $5 \times 10^{15}$ ions/cm$^2$ to $1 \times 10^{17}$ ions/cm$^2$. The ionic species being implanted can be $N^+$ or $N_2^+$, as both species allow for relatively high beam current when $N_2$ is used as a source gas. The implant energy may depend on the particular species being implanted and the desired projected range ($R_p$). The energy can be in a range of 15 keV to 100 keV when $N^+$ is the nitrogen-containing species, and 20 keV to 200 keV when $N_2^+$ is the nitrogen-containing species.

An optional anneal can be performed after the implant to repair implant damage. In an embodiment, the implant screen layer 202 may be retained during the anneal. When the implant screen layer 202 is present, the anneal can be performed at a relatively higher temperature, such as 950° C. and higher. In another embodiment, the implant screen layer 202 may be removed before performing the anneal. In such an embodiment, an oxidation may be performed at a temperature at most 900° C. before annealing at a higher temperature. The oxidizing gas may be flowing during the temperature ramp when performing the thermal oxidation. By retaining the implant screen layer 202 or growing an oxide layer, the amount of nitrogen that diffuses or evolves during the anneal can be kept low. If the anneal is performed at a temperature at most 900° C., the implant screen layer 202 or forming the thermal oxide is not required.

The anneal may be performed in oxygen (e.g., 100% $O_2$) or using an inert gas with a small concentration of oxygen (e.g., Ar with 1 vol. % to 5 vol. % $O_2$). The anneal can be performed at a temperature in a range of 600° C. to 1100° C. and may be performed at one temperature or at different temperatures. In a non-limiting embodiment, the anneal can be performed at a temperature in a range of 800° C. to 1000° C. As the implant dose is relatively high, a single furnace cycle can be used to perform a low-temperature anneal at 600° C. to 700° C. to anneal crystal damage within the semiconductor layer 104, oxidizing at a temperature in a range of 800° C. to 1000° C. using at least 90 vol. % $O_2$, followed by an anneal of at least 960° C. (glass transition temperature of $SiO_2$) using an inert gas with or without a small concentration of oxygen to help relieve stress. The previously described embodiments are merely illustrative, and many different embodiments, such as rapid thermal anneal or laser anneal, can be used to address damage caused by the ion implantation.

In another embodiment, the nitrogen-containing species can be introduced by a thermal operation. For example, $NH_3$ or $N_2H_2$ may be used as a source gas for a thermal operation. The workpiece may be taken to a relatively high temperature with the gas present to allow nitrogen to enter the substrate, and in an embodiment, to enter the semiconductor layer 104 along the sidewalls of the trenches 122, 124, and 126. The temperature can be in a range of 900° C. to 1200° C. with a time in a range of 0.5 hours to 12 hours. A lower temperature may have a longer time. For example, at 1000° C., the time may be in a range of 4 hours to 8 hours.

Figure 3:
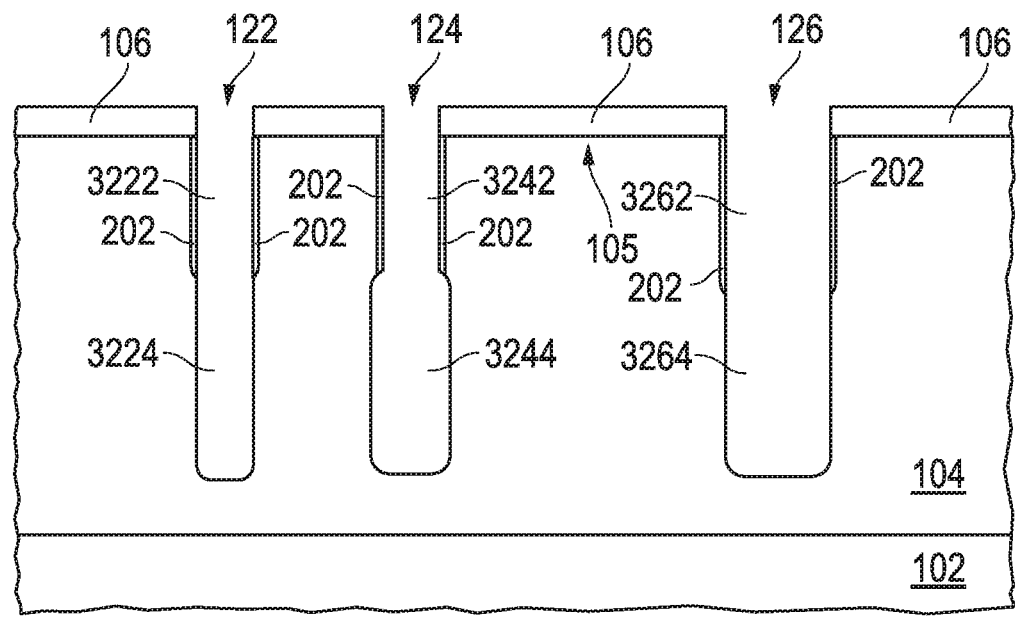
FIG. 3 includes an illustration of a cross-sectional view of the workpiece of FIG. 2 after extending the trenches.
Figure 4:
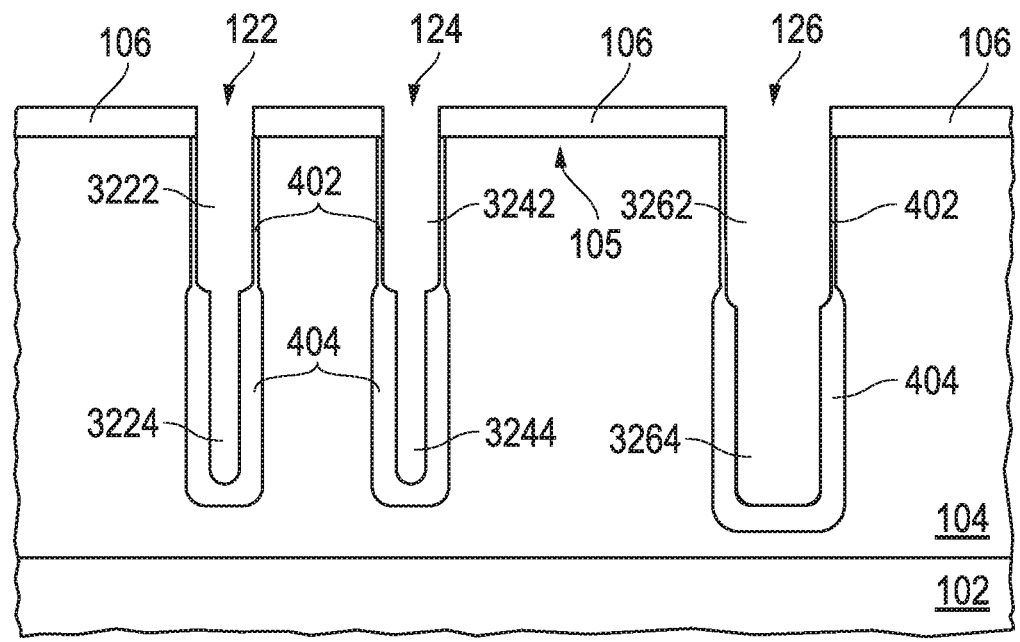
FIG. 4 includes an illustration of a cross-sectional view of the workpiece of FIG. 3 after thermally growing an oxide layer within the trenches.

The semiconductor layer 104 is etched to extend the trenches 122, 124, and 126 closer toward the underlying doped region 102, as illustrated in FIG. 3. The originally-formed portions 3222 and 3242 of the trenches 122 and 124 are regions where gate electrodes will be subsequently formed. The trench 126 includes an originally-formed portion 3262; however a gate electrode or other gate electrode connection is not formed within the trench 126. Extension portions 3224, 3244, and 3264 of the trenches 122, 124, and 126 are regions where a shield electrode will be formed.

The etch can be performed as an anisotropic etch and provide sidewalls within the extension portions (for example, the extension portions 3224 and 3264 of the trenches 122 and 126) that are aligned with the inner exposed surface of within the originally-formed portions 3222 and 3262 of the trenches 122 and 126. In another embodiment, the etch can be performed to allow for an adjustable undercut as seen with the extension portion 3244 of the trench 124. A Bosch etch process can be used to obtain the undercut as needed or desired. Although the trenches 122 and 126 are illustrated as having different shapes as compared to the trench 124, in an embodiment, all of the trenches 122, 124, and 126 can have sidewalls in their extension portions similar to the extension portions 3224 and 3264 (aligned with the inner exposed surface of within the originally-formed portions) or similar to the extension portion 3244 (undercut originally-formed portions). In subsequent figures, the extension portions 3224, 3244, and 3264 are illustrated with different shapes to illustrate how the undercut affects the shapes of structures formed in the trenches 122, 124, and 126.

A thermal oxidation is performed to form portions 402 and 404 of an oxide layer. The portion 402 grows at a significantly slower rate as compared to the portion 404 because of the nitrogen-containing species along the sidewalls of the originally-formed portions 3222, 3242, and 3262 of the trenches 122, 124, and 126. The portion 402 may grow at a rate that is in a range of 11% to 80% of the rate of the portion 404. The portion 402 may or may not include the implant screen layer 202. The thickness of the portion 402 may be in a range of 20% to 80% of the thickness of the portion 404. In terms of thickness, the portion 402 can have a thickness in a range of 110 nm to 500 nm, and the portion 404 can have a thickness in a range of 200 nm to 900 nm. Depending on the depth of the trenches 122 and 124, the thickness of portion 404 along the bottoms of the trenches 122 and 124 may be thinner than along the sidewalls of the extension portions 3224 and 3244 at a location spaced apart from the bottoms of the trenches. The trench 126 is typically wider, and the portion 404 may have no thinning or less thinning along the bottom of the trench 126.

A conductive layer is formed over the masking layer 106 and fills the remaining portions of the trenches 122, 124, and 126. The conductive layer can include a metal-containing or semiconductor-containing material. In an embodiment, the conductive layer can include a heavily doped semiconductor material, such as amorphous silicon or polysilicon. In another embodiment, the conductive layer includes a plurality of films, such as an adhesion film, a barrier film, and a conductive fill material. In a particular embodiment, the adhesion film can include a refractory metal, such as titanium, tantalum, or the like; the barrier film can include a refractory metal nitride, such as titanium nitride, tantalum nitride, or the like, a refractory silicide, such as tungsten silicide, titanium silicide, or the like, or a refractory metal-semiconductor-nitride, such as TaSiN; and the conductive fill material can include tungsten. In a more particular embodiment, the conductive layer can include Ti/TiN/W. The selection of the number of films and composition(s) of those film(s) depend on electrical performance, the temperature of a subsequent heat cycle, another criterion, or any combination thereof. Refractory metals and refractory metal-containing compounds can withstand high temperatures (e.g., melting points of such materials can be at least 1400° C.), may be conformally deposited, and have a lower bulk resistivity than heavily doped n-type silicon. After reading this specification, skilled artisans will be able to determine the composition of the conductive layer to meet their needs or desires for a particular application.

Figure 5:
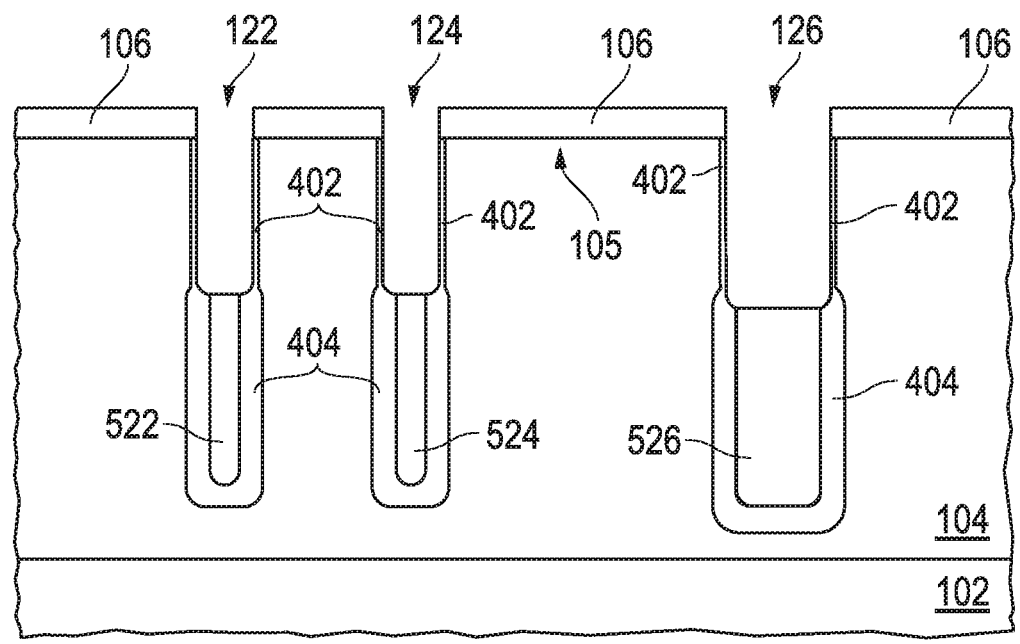
FIG. 5 includes an illustration of a cross-sectional view of the workpiece of FIG. 4 after forming conductive structures within the trenches.

A portion of the conductive layer that overlies the masking layer 106 outside of the trenches 122, 124, and 126 is removed to form conductive structures. The removal can be performed using a chemical-mechanical polishing or blanket etching technique. The masking layer 106 may be used as a polish-stop or etch-stop layer. The exposed portions of the conductive structures within the trenches 122, 124, and 126 are recessed to form recessed conductive structures 522, 524, and 526 within the trenches 122, 124, and 126, as illustrated in FIG. 5. The removal may be performed using a wet or dry etching technique. The highest elevations of the conductive structures 522, 524, and 526 lie below an elevation of the primary surface 105. The tops of the conductive structures 522, 524, and 526 can be approximately 0.6 micron to approximately 1.5 microns below the primary surface 105. When expressed as a percentage of a depth of a corresponding trench (that is, the trench in which a particular conductive structure is disposed), the conductive structures 522, 524, and 526 can have depths in a range of approximately 10% to approximately 60% of the depths of the corresponding trenches 122, 124, and 126. The conductive structures 522 and 524 are shield electrodes for the transistor structure being formed, and the conductive structure 526 is electrically connected to the conductive structures and is used to provide a routing of signals for the conductive structures 522 and 524. In another embodiment, a mask (not illustrated) may be used so that the conductive structure 526 is not recessed when forming the conductive structures 522 and 524. In such an embodiment, the conductive structure 526 may be recessed but not recessed as much as the conductive structures 522 and 524.

In another embodiment, the trenches 122, 124, and 126 may be replaced by a single trench with different portions similar to the trenches 122, 124, and 126, as the portions would be connected at a region not illustrated in FIG. 5. Similarly, the conductive structures 522, 524, and 526 may be replaced by a single conductive structure with different portions similar to the conductive structures 522, 524, and 526, as the portions would be connected at a region not illustrated in FIG. 5.

Figure 6:
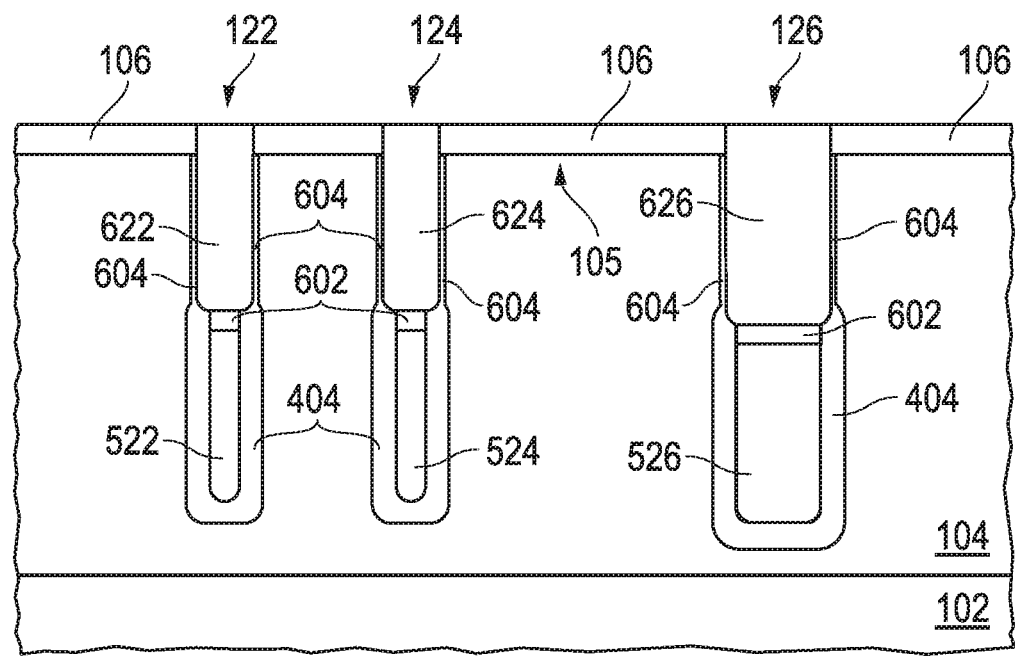
FIG. 6 includes an illustration of a cross-sectional view of the workpiece of FIG. 5 after forming an insulating layer and conductive structures within the trenches.

Insulating members 602 are formed over the conductive structures 522, 524, and 526, as illustrated in FIG. 6. The insulating members 602 can include an oxide, a nitride, an oxynitride, or any combination thereof. The insulating members 602 can have a thickness in a range of approximately 20 to 300 nm. The insulating members 602 can be formed by a thermal growth or deposition process. In an embodiment, the portions 402 of the oxide layer can be removed, and a gate dielectric layer 604 can be formed within the trenches 122, 124, and 126. After the portions of the oxide layer 402 are removed and before forming the gate dielectric layer 604, a heat treatment can be performed to remove any residual nitrogen along the surface. The residual nitrogen may interfere with the formation of the gate dielectric layer 604, and thus, the heat treatment can help form the gate dielectric layer 604 closer to its desired thickness. The heat treatment can be performed at a temperature in a range of 900° C. to 1100° C. for a time in a range of 0.5 hour to 2 hours. The heat treatment may be integrated to be performed during the same furnace cycle when subsequently forming the gate dielectric layer 604. The gate dielectric layer 604 can have a thickness in a range of approximately 10 nm to approximately 70 nm and can be formed by a thermal growth, deposition process, or a combination of thermal growth and deposition. In another embodiment, the portions 402 of the oxide layer can be retained and used as a gate dielectric layer.

A conductive layer is formed over the masking layer 106 and insulating members 602 and along the gate dielectric layer 604 and fills remaining portions of the trenches 122, 124, and 126. The conductive layer can include any of the materials, number of films, and be formed using any of the techniques previously described with respect to the conductive layer when forming the conductive structures 522, 524, and 526. The conductive layer that is adjacent to the gate dielectric layer 604 may have the same or different composition, include the same number or a different number of films, or be formed with the same or different technique as compared to the conductive layer used to form the conductive structures 522, 524, and 526.

A portion of the conductive layer that overlies the masking layer 106 outside of the trenches 122, 124, and 126 is removed to form the gate members 622 and 624 within the trenches 122 and 124, and a conductive structures 626 within the trench 126, as illustrated in the embodiment of FIG. 6. The removal can be performed using a chemical-mechanical polishing or blanket etching technique. The masking layer 106 may be used as a polish-stop or etch-stop layer. The gate members 622 and 624 can include gate electrodes for the transistor structures. The conductive structure 626 protects underlying features during subsequent process and will be removed at a later point in the process.

Figure 7:
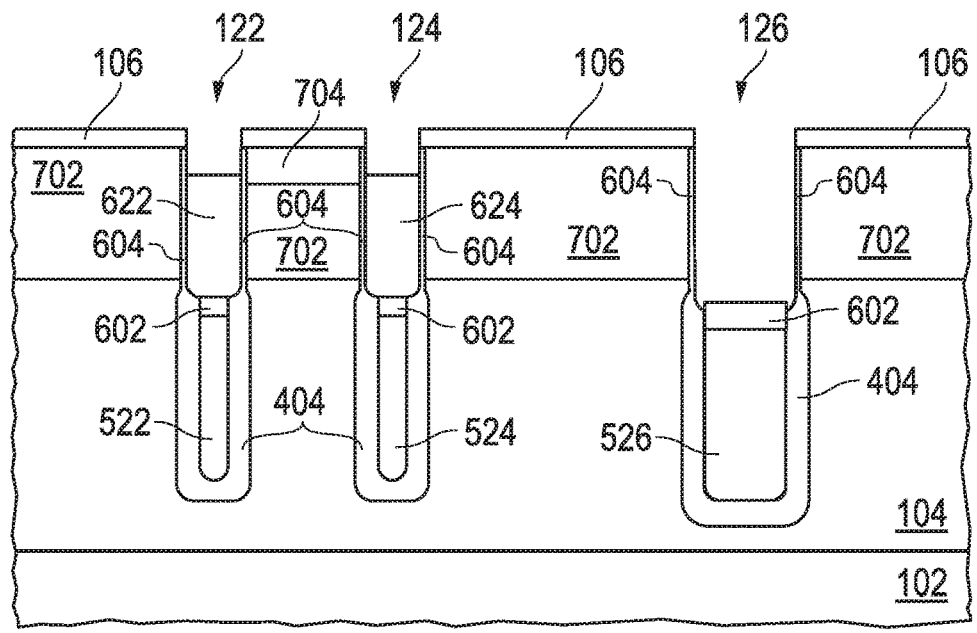
FIG. 7 includes an illustration of a cross-sectional view of the workpiece of FIG. 6 after forming gate members within the trenches and a well region and heavily doped region outside the trenches.

Body regions 702 and source regions 704 can be formed within the active area, as illustrated in FIG. 7. The body regions 702 include channel regions for the transistor structures. The body regions 702 have an opposite conductivity type as compared to the semiconductor layer 104. In an embodiment, within the active area, the elevations of the bottoms of the body regions 702 are above the elevation for lowermost points of the gate members 622 and 624. The body regions 702 have a peak dopant concentration in a range of approximately $5 \times 10^{16}$ atoms/cm$^3$ to approximately $1 \times 10^{18}$ atoms/cm$^3$ and extends to a depth approximately 0.2 microns to approximately 0.9 microns from the primary surface 105. The body regions 702 can be formed with a single implant or with a chain of implants.

The source region 704 is formed from a portion of the semiconductor layer 104 and is disposed over portions of the body regions 702. The source region 704 has the same conductivity type as compared to the semiconductor layer 104 and opposite that of the body regions 702. The source region 704 has a peak dopant concentration of at least approximately $1 \times 10^{19}$ atoms/cm$^3$ and extends to a depth approximately 0.05 microns to approximately 0.5 microns from the primary surface 105. The source region 704 can be formed with an implant or another suitable technique. For an insulated gate bipolar transistor, an emitter region would be formed instead of a source region. The dopant type, concentration, and depth would be the same as described with respect to the source region 704.

The gate members 622 and 624 are recessed within the trenches 122 and 124 to reduce source-to-gate capacitive coupling. The lower capacitive coupling allows the transistor structures to be turned on and off more quickly. The conductive member 626 is removed from the trench 126 to allow a subsequently contact to be made more easily to the conductive member 426. A mask (not illustrated) can be formed over the gate members 622 and 624 to protect the gate members 622 and 624 when the conductive member 626 is being removed. The mask is removed after removing the conductive member 626. The order of recessing the gate members 622 and 624 and removing the conductive member 626 can be performed in either order.

Figure 8:
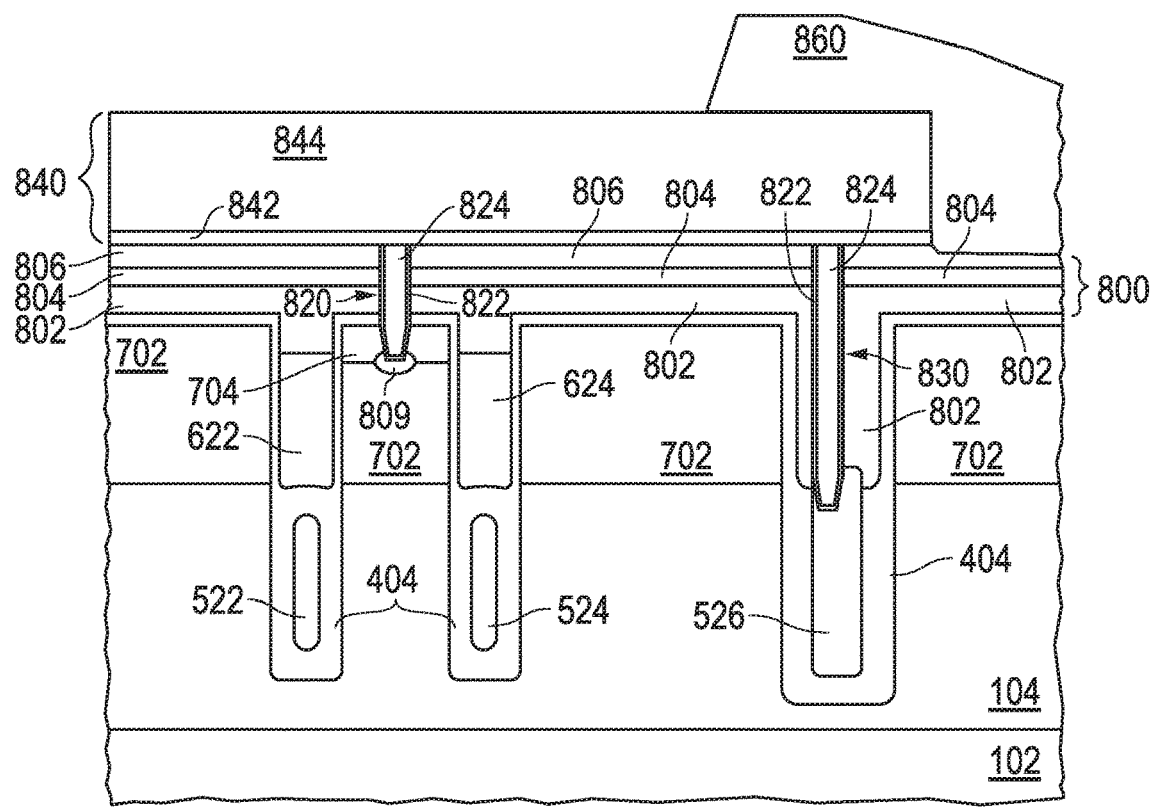
FIG. 8 includes an illustration of a cross-sectional view of the workpiece of FIG. 7 after forming a substantially completed electronic device.

FIG. 8 includes an illustration of a substantially completed electronic device. An interlevel dielectric ("ILD") layer 800 is formed and etched to define contact openings. The ILD layer 800 can include one or more films, each of which can include an oxide, a nitride, an oxynitride, or any combination thereof. In the embodiment as illustrated in FIG. 8, the ILD layer 800 includes an oxide film 802 that overlies the masking layer 106 and fills in the remainder of the trenches 122, 124, and 126. After depositing the oxide film 802 is planarized. A nitride film 804 and an oxide film 806 are formed over the oxide film 802.

The ILD layer 800 is patterned to define contact openings that extend through the ILD layer 800. One of the contact openings extends through the source region 704 to the body region 702 within the active area, and another contact opening extends through the ILD layer 800 to the conductive structure 426 within the conductive electrode contact area. Although not illustrated, another contact opening extends through the ILD layer 800 to a conductive structure within a gate contact area that is electrically connected to the gate members 522 and 524. A body contact region 809 is formed along the bottom of the contact opening that extends to the body region 702 to form an ohmic contact between the body region 702 and a subsequently-formed conductive plug. The body contact region 809 can be a heavily doped region having a dopant concentration of at least $1 \times 10^{19}$ atoms/cm$^3$ and the same conductivity type as the body region 702.

Conductive plugs 820 and 830 are formed by depositing a conductive layer and etching portions of the conductive layer outside the contact openings that extend through the ILD layer 800. The conductive plug 820 forms an ohmic contact to the body region 702 and the source region 704, and the conductive plug 830 forms an ohmic contact to the conductive structure 426. The conductive layer for the conductive plugs 820 and 830 can include any of the materials, films, or both as described with respect to the conductive layer for the conductive structures 422, 424, and 426. In an embodiment, the conductive layer for the conductive plugs 820 and 830 have a different composition or a different number of films as compared to the conductive structure 422, 424, and 426. In a particular embodiment, the conductive plugs 820 and 830 include a liner film 822 and a bulk film 824. The liner film 822 can be an adhesion film or a barrier film and include Ti, Ta, TiN, Ti:W, or the like, and the bulk film 824 can include W. After removing portions of the conductive layer lying outside the contact openings, the conductive plugs 820 and 830 are formed. Other conductive plugs may be formed but are not illustrated in FIG. 8.

An interconnect 840 can be formed over the ILD layer 800 and the contact plugs 820 and 830. In the embodiment as illustrated in FIG. 8, the interconnect 840 is a source electrode and directly contacts and the conductive plugs 820 and 830. Thus, the source region 704 is electrically connected to the body contact region 809 via the conductive plug 820, and electrically connected to the conductive structure 426 via the conductive plugs 820 and 830 and the interconnect 840. Although not illustrated, another interconnect member may be formed at the current interconnect level or at a subsequent interconnect level, where such other interconnect member is electrically connected to the gate members 622 and 624. A collector contact for an IGBT or a drain contact for a vertical field-effect transistor may be formed to the backside of the workpiece to underlying doped region 102 or may be formed near the primary surface 105 if a topside contact is desired.

The interconnect member 840 can be formed from a conductive layer that can include any of the materials, number of films, and be formed using any of the techniques previously described with respect to the conductive layer when forming the conductive structures 422, 424, and 426. In an embodiment, the conductive layer for the interconnect 840 has a different composition or a different number of films as compared to the conductive structure 422, 424, and 426. In a particular embodiment, the interconnect 840 includes an adhesion or barrier film 842 and a bulk film 844. The adhesion or barrier film 842 can include Ti, Ta, TiN, Ti:W, or the like, and the bulk film 844 can include principally include aluminum, copper, or a noble metal. The thickness of the conductive layer can be in a range of approximately 0.5 micron to approximately 5.0 microns. The interconnect 840 can be formed using an in-laid technique or using a resist layer and a lithographic technique.

A passivation layer 860 can be formed over ILD layer 800 and a portion of the interconnect 840. For other interconnects (not illustrated), such interconnects that will receive conductive bumps or external electrical connections (e.g., wires, clips, or the like) will be partly covered by the passivation layer 860, and other interconnects that do not receive conductive bumps or external electrical connections will be completely covered by the passivation layer 860.

The interconnect 840 can be electrically connected to or can be an emitter terminal for an IGBT or a source terminal for a vertical field-effect transistor, which during normal operation may be at $V_{SS}$ or approximately ground potential. Another interconnect member (not illustrated) that is electrically connected to the gate members 622 and 624 can be electrically connected to a gate terminal or a gate controller within the electronic device.

The electronic device can include many transistor structures substantially similar to the transistor structures illustrated in FIG. 8 with the transistor structures connected in parallel with their corresponding gate members connected to the gate terminal or gate controller. All of the transistor structures can be power transistors.

Embodiments as described above allow for different thicknesses of oxide to be grown during the same oxidation operation. The oxidation rate of a region can be reduced by introducing a nitrogen-containing species into the substrate. The concepts described herein are well suited for portions of an electronic device where patterning operations are difficult or otherwise undesired. In an embodiment, different oxidation rates within a trench can be achieved to allow different thicknesses of an oxide layer to be formed. In another embodiment, the concepts can be extended to other electronic devices. For example, a relatively thinner tunnel dielectric layer and a relatively thicker gate dielectric layer may be formed during the same thermal oxidation when forming a floating gate memory cell.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the embodiments as listed below.

Embodiment 1

An process of forming electronic device can include: providing a substrate having a first portion and a second portion;
introducing a nitrogen-containing species into the second portion of the substrate; and
exposing the substrate to an oxidizing ambient, wherein a thicker oxide is grown from the first portion as compared to the second portion.

Embodiment 2

The process of Embodiment 1, wherein:
introducing a nitrogen-containing species comprises introducing a nitrogen-containing species into the first portion of the substrate; and
the process further comprises removing the first portion of the substrate that includes the nitrogen-containing species while the second portion of the substrate that includes the nitrogen-containing species remains.

Embodiment 3

The process of Embodiment 2, further comprising patterning the substrate to define a trench having a sidewall, wherein patterning the substrate is performed before introducing the nitrogen-containing species.

Embodiment 4

The process of Embodiment 3, wherein introducing the nitrogen-containing species is performed by ion implantation using a tilt angle to introduce the nitrogen-containing species into the substrate along the sidewall.

Embodiment 5

The process of Embodiment 4, further comprising rotating the substrate during introducing the nitrogen-containing species or between different portions of introducing the nitrogen-containing species to ensure the nitrogen-containing species is implanted along different surfaces of the sidewall of the trench.

Embodiment 6

The process of Embodiment 1, further comprising forming an oxide layer over a portion of the substrate, wherein the oxide layer is present over the substrate when the nitrogen-containing species is introduced into the substrate.

Embodiment 7

The process of Embodiment 1, wherein introducing the nitrogen-containing species is performed by ion implantation.

Embodiment 8

The process of Embodiment 7, wherein a source gas for the nitrogen-containing species includes $N_2$, $N_2H_2$, $NH_3$, or the like.

Embodiment 9

The process of Embodiment 8, wherein the nitrogen-containing species is $N^+$ or $N_2^+$.

Embodiment 10

The process of Embodiment 9, wherein the ion implantation is performed at a dose of at least $1 \times 10^{15}$ ions/cm$^2$.

Embodiment 11

The process of Embodiment 9, wherein the ion implantation is performed at an energy in a range of 15 keV to 100 keV when $N^+$ is the nitrogen-containing species, and 20 keV to 200 keV when $N_2^+$ is the nitrogen-containing species.

Embodiment 12

The process of Embodiment 1, wherein the oxidizing ambient includes $H_2O$, $O_2$, $O_3$, or $N_2O$.

Embodiment 13

The process of Embodiment 1, wherein removing the first portion comprises etching the substrate to deepen the trench.

Embodiment 14

The process of Embodiment 1, further comprising annealing the substrate after introducing the nitrogen-containing species and before exposing the substrate to the oxidizing ambient.

Embodiment 15

The process of Embodiment 14, further comprising:
forming an implant screen layer before introducing the nitrogen-containing species into the second portion of the substrate, wherein the implant screen layer is retained during annealing the substrate; or
forming an oxide layer along the second portion of the substrate, wherein forming the oxide layer is performed at a temperature of at most 900° C., after introducing the nitrogen-containing species into the second portion of the substrate, and before exposing the substrate to a temperature of at least 950° C. during the anneal.

Embodiment 16

A process of forming electronic device comprising:
patterning a substrate to define an originally-formed trench having a sidewall;
forming an oxide layer along the sidewall;
implanting the substrate with $N^+$ or $N_2^+$, wherein implanting is performed at a tilt angle in a range of 7° to 30° and a dose of at least $1 \times 10^{15}$ ions/cm$^2$;
annealing the substrate after implanting the substrate;
etching the substrate to extend a depth of the trench after implanting the substrate to define a trench extension below the originally-formed trench; and
oxidizing the substrate using $H_2O$, wherein a thicker oxide is grown in the trench extension as compared to the originally-formed trench.

Embodiment 17

A process of forming an electronic device comprising:
patterning a substrate to define an originally-formed trench having a sidewall, wherein the originally-formed trench extends from a primary surface of the substrate;
introducing a nitrogen-containing species into the substrate;
etching the substrate to extend a depth of the trench after implanting the substrate to define a trench extension below the originally-formed trench;
exposing the substrate to an oxidizing ambient, wherein a thicker oxide is grown in the trench extension as compared to the originally-formed trench;
forming a shield electrode within the trench extension;
forming an insulating layer over the shield electrode;
forming a gate electrode within the originally-formed trench and over the insulating layer; and
forming an emitter region or a source region adjacent to the primary surface of the substrate.

Embodiment 18

The process of Embodiment 17, further comprising forming a gate dielectric layer before forming the gate electrode.

Embodiment 19

The process of Embodiment 18, further comprising:
exposing at least a portion of the sidewall of originally-formed trench after exposing the substrate to an oxidizing ambient; and
performing a heat treatment to reduce an amount of the nitrogen-containing species adjacent to the at least a portion of the sidewall before forming the gate dielectric layer.

Embodiment 20

The process of Embodiment 17, further comprising forming a well region adjacent to the primary surface of the substrate, wherein the well region has a conductivity type opposite that of the substrate.

Embodiment 21

The process of Embodiment 17, further comprising recessing the gate electrode within the trench.

Embodiment 22

The process of Embodiment 17, wherein introducing the nitrogen-containing species into the substrate comprising performing a tilt angle implant so that the nitrogen-containing species is implanted into the sidewall.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A process of forming an electronic device comprising:
etching a substrate to define a first trench and a second trench spaced apart from the first trench, each of the first and second trenches extends from a primary surface, wherein:

a first portion of the substrate lies along a first sidewall of the first trench, and the first portion includes a semiconductor material, and a second portion of the substrate lies along a second sidewall of the second trench and includes the semiconductor material;

ion implanting a nitrogen-containing species into the first portion and the second portion of the substrate to form a first nitrogen-containing region and a second nitrogen-containing region;

etching the substrate to extend a depth of the first trench to define a first trench extension that extends into the substrate and to extend a depth of the second trench to define a second trench extension that extends into the substrate, wherein:

a third portion of the substrate lies along the first trench extension and includes the semiconductor material, a fourth portion of the substrate lies along the second trench extension and includes the semiconductor material, and etching the substrate to extend the depths of the first and second trenches is performed after ion implanting the nitrogen-containing species;

exposing the first, second, third, and fourth portions of the substrate to an oxidizing ambient, wherein a thicker oxide is grown from the third and fourth portions as compared to the first and second portions;

forming a shield electrode within the first trench extension and the second trench extension after exposing the substrate to the oxidizing ambient;

forming an insulating layer over the shield electrode;

forming a gate electrode within the second trench and over the insulating layer; and forming an emitter region or a source region adjacent to the primary surface of the substrate, wherein in a finished device, a gate electrode is not within the first trench.

2. The process of claim 1, wherein:

ion implanting the nitrogen-containing species further comprises ion implanting the nitrogen-containing species into a fifth portion of the substrate, wherein the fifth portion lies along a bottom of the first trench after etching the substrate to define the first and second trenches; and etching the substrate to extend the first trench and the second trench comprises removing the fifth portion of the substrate that includes the nitrogen-containing species while the first portion of the substrate that includes the nitrogen-containing species remains.

3. The process of claim 1, wherein exposing the first, second, third, and fourth portions of the substrate to the oxidizing ambient is performed to oxidize the semiconductor material along all of the first sidewall of the first trench, including the first trench extension, and all of the second sidewall of the second trench, including the second trench extension, to form a relatively thinner oxide from the semiconductor material within the first nitrogen-containing region and the second nitrogen-containing region and a relatively thicker oxide from the semiconductor material within the third and fourth portions.

4. The process of claim 1, wherein ion implanting the nitrogen-containing species is performed using a tilt angle.

5. The process of claim 4, further comprising rotating the substrate during ion implanting the nitrogen-containing species or between different portions of ion implanting the nitrogen-containing species to ensure the nitrogen-containing species is implanted along different surfaces of the first sidewall of the first trench and the second sidewall of the second trench.

6. The process of claim 4, wherein the nitrogen-containing species is $N^+$ or $N_2^+$.

7. The process of claim 6, wherein the ion implantation is performed at a dose of at least $1\times10^{15}$ ions/cm$^2$.

8. The process of claim 6, wherein the ion implantation is performed at an energy in a range of 15 keV to 100 keV when $N^+$ is the nitrogen-containing species, and 20 keV to 200 keV when $N_2^+$ is the nitrogen-containing species.

9. The process of claim 1, further comprising annealing the substrate after ion implanting the nitrogen-containing species and before exposing the first, second, third, and fourth portions of the substrate to the oxidizing ambient.

10. The process of claim 9, further comprising:

forming an implant screen layer before ion implanting the nitrogen-containing species, wherein the implant screen layer is retained during annealing the substrate.

11. The process of claim 9, further comprising:

exposing the first, second, third, and fourth portions of the substrate to an oxidizing ambient comprises forming the oxide layer at a temperature of at most 900° C. after ion implanting the nitrogen-containing species and before exposing the substrate to a temperature of at least 950° C. during the anneal.

12. The process of claim 1, further comprising forming a gate dielectric layer before forming the gate electrode.

13. The process of claim 12, wherein forming the gate dielectric layer comprises forming the gate dielectric layer that is thinner than an oxide formed within the second trench extension portion of the second trench.

14. The process of claim 12, further comprising:

performing a heat treatment to reduce an amount of the nitrogen-containing species adjacent to the at least a portion of the second sidewall before forming the gate dielectric layer.

15. The process of claim 12, wherein ion implanting the nitrogen-containing species comprises performing a tilt angle implant.

16. The process of claim 1, further comprising forming a well region adjacent to the primary surface of the substrate, wherein the well region has a conductivity type opposite that of the substrate.

17. The process of claim 1, wherein ion implanting the nitrogen-containing species comprises ion implanting the nitrogen-containing species along a center of a bottom surface of the first trench, and ion implanting the nitrogen-containing species is performed before etching the substrate to extend the depth of the first trench.

18. The process of claim 17, wherein:

etching the substrate to define the first trench and the second trench is performed such that the second trench is narrower than the first trench.

19. The process of claim 18, wherein ion implanting the nitrogen-containing species is performed by ion implantation using a tilt angle.

20. The process of claim 17, where:

ion implanting the nitrogen-containing species is performed such that a dose of the nitrogen-containing species along a center of a bottom surface of the second trench is lower than a dose of the nitrogen-containing species along the center of the bottom surface of the first trench.

* * * * *